United States Patent
Lee et al.

(10) Patent No.: US 6,815,776 B2
(45) Date of Patent: Nov. 9, 2004

(54) MULTI-FINGER TYPE ELECTROSTATIC DISCHARGE PROTECTION CIRCUIT

(75) Inventors: Myoung Goo Lee, Cheongju (KR); Hong Bae Park, Cheongju (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/028,432

(22) Filed: Dec. 28, 2001

(65) Prior Publication Data

US 2002/0084491 A1 Jul. 4, 2002

(30) Foreign Application Priority Data

Dec. 30, 2000 (KR) .......................................... 2000-87295

(51) Int. Cl.[7] .............................................. H01L 23/62
(52) U.S. Cl. ....................... 257/361; 257/355; 257/360; 257/362; 257/401
(58) Field of Search ................................ 257/341, 342, 257/173, 355, 356, 360, 361, 362, 401, 546, 566, 567; 361/100, 101

(56) References Cited

U.S. PATENT DOCUMENTS

| | | | | | |
|---|---|---|---|---|---|
| 5,834,814 A | * | 11/1998 | Ito | .............................. | 257/378 |
| 5,847,429 A | * | 12/1998 | Lien et al. | .................... | 257/355 |
| 5,895,940 A | * | 4/1999 | Kim | ............................. | 257/173 |
| 5,955,763 A | * | 9/1999 | Lin | .............................. | 257/355 |
| 6,097,066 A | * | 8/2000 | Lee et al. | .................... | 257/355 |
| 6,191,461 B1 | * | 2/2001 | Tsukude | ...................... | 257/355 |
| 6,259,139 B1 | * | 7/2001 | Pan | ............................. | 257/355 |
| 6,323,523 B1 | * | 11/2001 | Lee et al. | .................... | 257/355 |

FOREIGN PATENT DOCUMENTS

| | | |
|---|---|---|
| JP | 04-105357 | 7/1992 |
| JP | 05-267597 | 10/1993 |
| JP | 09-181195 | 7/1997 |
| JP | 2000-040751 | 8/2000 |

* cited by examiner

Primary Examiner—Tom Thomas
Assistant Examiner—Matthew C Landau
(74) Attorney, Agent, or Firm—Birch, Stewart, Kolasch & Birch, LLP

(57) ABSTRACT

A multi-finger type electrostatic discharge protection circuit is disclosed. In an NMOS type ESD protection circuit, a pair of gates are formed in parallel with each other in one of multiple active regions so as to enable all the gate fingers in the active regions to perform npn bipolar operations uniformly. The present invention discharges an ESD pulse effectively by forming one or more additional n+ (or p+) type active regions, which are connected to Vcc (or Vss), between respective active regions.

19 Claims, 2 Drawing Sheets

MULTI-FINGER TYPE ELECTROSTATIC DISCHARGE PROTECTION CIRCUIT

RELATED APPLICATION

The present application claims the benefit of Korean Patent Application No. 87295/2000 filed Dec. 30, 2000, under 35 U.S.C. § 113, which is herein fully incorporated by reference.

BACKGROUND OF THE INVENTION

1. Field of the Invention

The present invention relates to an electrostatic discharge protection circuit, and more particularly, to a multi-finger type electrostatic discharge protection circuit.

2. Background of the Related Art

Electrostatic discharge (ESD) characteristics Of a device generally depend an whether or not the MOS transistors of an ESD protection circuit properly allow the discharge of ESD pulses. A general ESD protection circuit has a multi-finger structure in which a plurality of gates are arranged consecutively in a single active area so as to discharge the ESD pulses.

FIG. 1 illustrates a layout of a multi-finger type ESD protection circuit according to a related art.

Referring to FIG. 1, in this multi-finger type ESD protection circuit having NMOS transistors, a plurality of gates (gate fingers) 103 are arranged in a large active region 100 side by side in a multi-finger configuration. A n+ type source region 101 and a n+ type drain region 102 are symmetrically arranged on both sides of each gate 103 to form NMOS type transistors. Contacts 104 and a p+ type active region 105 for bulk (substrate) bias are provided around the active region 100.

Generally, the drain region 102 is connected to an input or output pad, and the source and active regions 101 and 105 are connected to a ground Vss. The gates 103 are also connected to the ground Vss. If the NMOS transistor is used as a pull-down transistor, the gate 103 is connected to an output of a pull-down inverter as known in the art.

The npn bipolar operation between an n+ junction of the source region 101 and the other n+ junction of the adjacent drain region 102 discharges, as known, a positive ESD pulse having been applied thereto through an input/output pad as a Vcc reference voltage. A negative ESD pulse having been applied thereto through an input/output pad as a Vcc reference voltage is discharged by the forward npn bipolar operation between an n+ junction of the drain region 102 and the p+ junction of the active region 105.

FIG. 2 is a functional diagram of the ESD protection circuit having the multi-finger type NMOS transistors as shown in FIG. 1.

As mentioned in the above explanation, in FIG. 2, if a Vcc reference voltage is applied to a particular input/output pad 11 connected to the drain regions, the corresponding NMOS transistor 10 discharges an ESD pulse by an npn bipolar operation between n+ junctions of the source and drain regions of the corresponding NMOS transistor 10.

However, it may happen that portions of the gate fingers are not turned on in a conventional multi-finger type NMOS transistor structure when an ESD pulse is applied thereto. As a result, npn bipolar operations are not carried out uniformly in all the gate fingers. But, the parasitic npn bipolar operation occurs locally in some of the gate fingers. Thus, the other gate fingers fail to perform the parasitic npn bipolar operation. Such a phenomenon worsens as the number of multi-finger type transistors increases, whereby the ESD protection circuit according to the related art fails to carry out the ESD protection function as designed.

Further, a Vcc reference ESD pulse having been applied thereto through an input/output pad as a Vcc reference is discharged by a forward non bipolar operation between the n+ junction of the drain region and the p+ junction of the active region. Yet, all of the n+ junctions of the drain regions in the conventional multi-finger type NMOS transistor structures fail to have uniform resistance against the p+ junction of the active region, whereby the ESD pulse discharge performance of the ESD protection circuit according to the related art is weak and needs improvement.

SUMMARY OF THE INVENTION

Accordingly, the present invention is directed to a multi-finger type electrostatic discharge protection circuit/device that substantially obviates one or more problems due to limitations and disadvantages of the related art.

An object of the present invention is to provide a multi-finger type electrostatic discharge protection circuit/device with improved ESD protection performance and characteristics.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a multi-finger type electrostatic discharge protection circuit according to an embodiment of the present invention includes a semiconductor substrate, a plurality of active regions formed separately on the semiconductor substrate, and a pair of gates formed on each of the respective active regions. Preferably, the present invention discharges an ESD pulse effectively by forming additional n+ (or p+) type active regions, which are connected to Vcc (or Vss), between the respective active regions.

In another aspect of the present invention, a multi-finger type electrostatic discharge protection circuit includes a semiconductor substrate, a plurality of active regions formed separately on the semiconductor substrate, a pair of gates formed on each of the respective active regions, and predetermined conductive type active regions formed between the respective active regions.

In a further aspect of the present invention, a multi-finger type electrostatic discharge protection circuit includes a semiconductor substrate, a plurality of active regions formed separately on the semiconductor substrate, a pair of gates formed on each of the respective active regions, drain regions formed at n+ junctions of both ends of the respective active regions, source regions formed between the two gates of the respective active regions, and predetermined conductive type active regions formed between the respective active regions.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
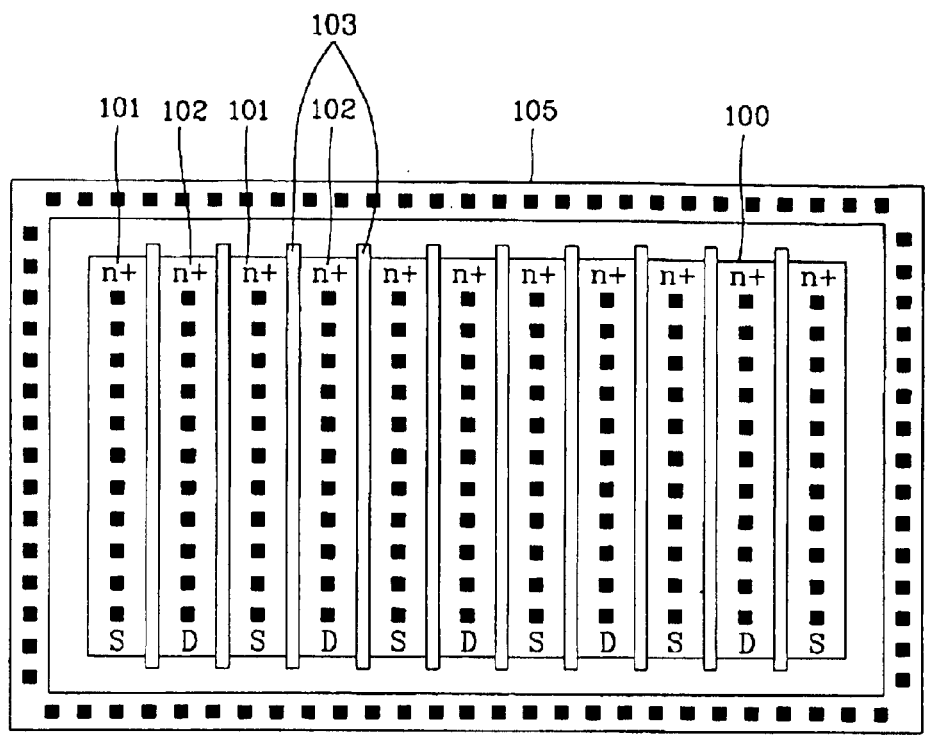
FIG. 1 illustrates a layout of a multi-finger type ESD protection circuit according to a related art.
Figure 2:
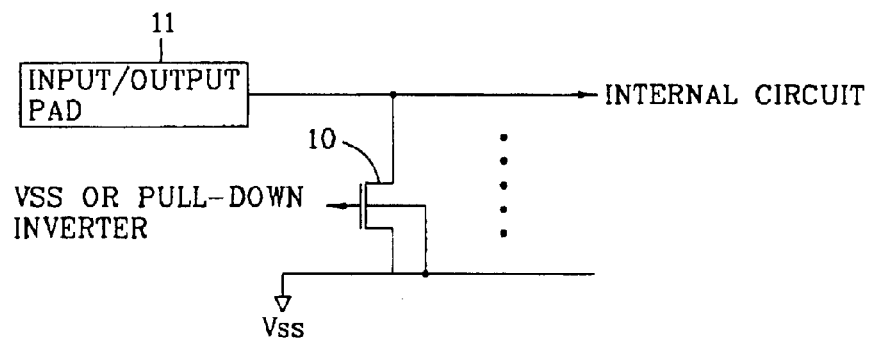
FIG. 2 illustrates a functional diagram of a portion of the ESD protection circuit in FIG. 1 according to a related art.
Figure 3:
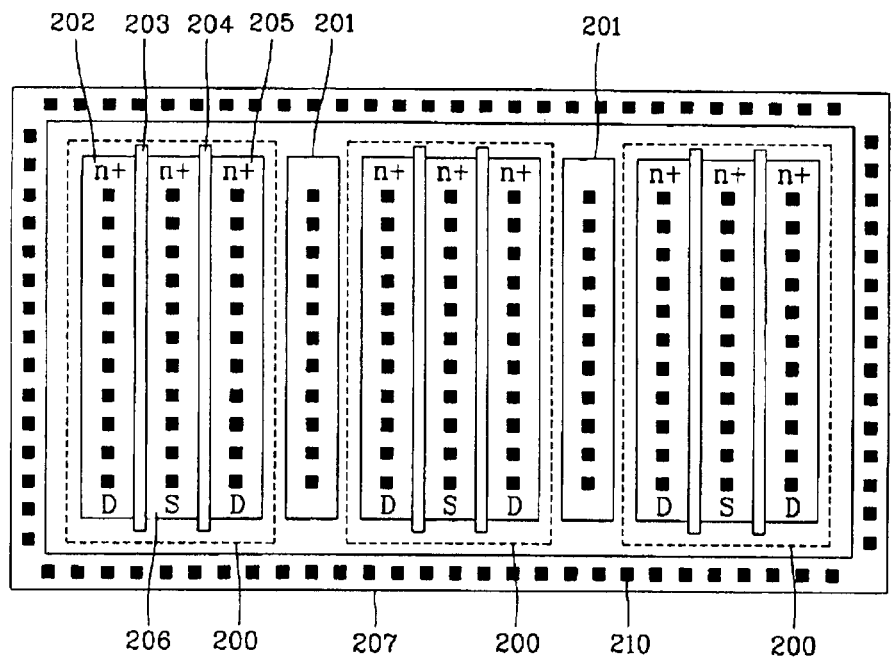
FIG. 3 illustrates a layout of a multi-finger type ESD protection circuit according to an embodiment of the present invention.

FIG. 3 illustrates a layout of a multi-finger type ESD protection circuit according to an embodiment of the present invention.

Referring to FIG. 3, in an ESD protection circuit according to the present invention, a plurality of active regions 200 are provided. For each active region 200, a pair of gates 203 and 204 are formed in the active region 200, a pair of drain regions 202 and 205 are formed at an n+ junction of both ends of the active region 200, and a source region 206 is formed at the n+ junction between the gates 203 and 204 to form multi-finger type NMOS transistors. A separated, predetermined type (n+ or p+) active region 201 is arranged between two adjacent active regions 200. Moreover, a p+ type active region 207 as a guard ring and contacts 210 are formed at a circumference of the multi-finger type NMOS transistors, which is identical to the features of the related art.

For each active region 200, the drain regions 202 and 205 are connected to an input or output pad, the source region 206 is connected to a ground Vss, and the pair of the gates 203 and 204 are connected to the ground Vss or an output of a pull-down inverter when used as a pull-down transistor. The n+ active region 201 between two active regions 200 is connected to Vcc reference voltage (or ground Vss when the active region 201 is of p+ type).

Figure 4:
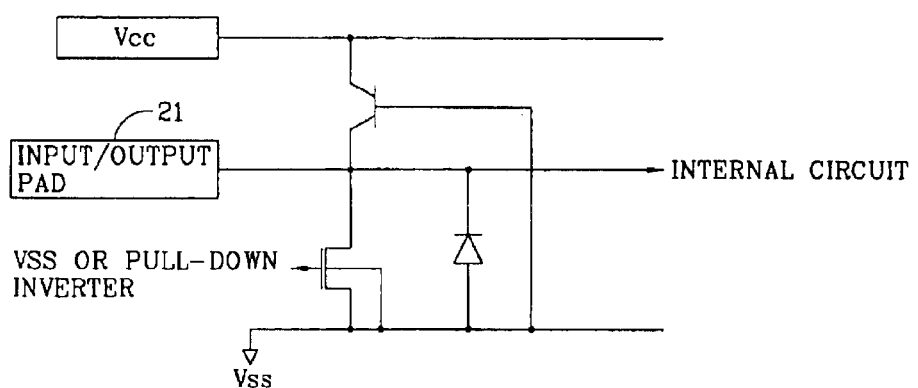
FIG. 4 illustrates a functional diagram of a portion of the ESD protection circuit in FIG. 3 according to the present invention.

The electrostatic discharging operation of the ESD protection circuit according to the present invention for different scenarios is now described by referring to FIGS. 3 and 4.

Scenario (1): when the active region 201 of n+ type is formed between two adjacent active regions 200.

In this scenario, if a positive ESD pulse (e.g., as a Vcc reference voltage) is applied thereto through an input/outut pad 21 connected the multi-finger transistors, the applied ESD pulse is effectively discharged by an npn bipolar operation occurring between the n+ junctions of the drain and source regions 202 and 206 of the active region 200 as well as by a parasitic npn bipolar operation occurring between the drain region 205 and the n+ active region 201.

If a negative ESD pulse is applied thereto through the input/output pad 21, an np diode operation occurring between the n+ junction of the drain region 202 and the p+ junction of the active region 207 effectively discharges the applied ESD pulse.

Scenario (2): when the active region 201 of p+ type is formed between two active regions 200.

In this scenario, if a positive ESD pulse is applied thereto through an input/output pad 21, the applied ESD pulse is effectively discharged by an npn bipolar operation occurring between the n+ junctions of the drain and source regions 202 and 206.

If a negative ESD pulse is applied thereto to through the input/output pad 21, the negative ESD pulse is effectively discharged by an np diode operation occurring between the n+ junction of the drain region 202 and the p+ junction of the active region 207 as well as a forward npn diode operation occurring between the drain region 202 and the p+ active region 201.

As mentioned in the above description, the NMOS type ESD protection circuit of the present invention is designed such that a pair of gates are formed in parallel with each other in a single active region to enable all the gate fingers in the ESD protection circuit to perform npn bipolar operations uniformly.

The present invention discharges an ESD pulse effectively by forming additional or auxiliary n+ (or p+) type active regions between respective active regions. These additional active regions are connected to Vcc (or Vss).

Accordingly, the present invention provides a pair of gates in a single active region for designing an NMOS type ESD protection circuit unit. By connecting the NMOS type ESD protection circuit units in parallel each other and by keeping uniform parasitic npn bipolar operations between the respective drains and sources, the present invention provides an ESD protection circuit/device having ESD characteristic that is more excellent than that of the related art.

Furthermore, the present invention provides n+ (or p+) junctions, which are connected to Vcc reference voltage (or ground Vss), additionally between respective active regions each of which includes a limited number of gates (e.g., two gates). Accordingly, the present invention effectively discharges a positive ESD pulse by a parasitic npn bipolar operation occurring between the n+ junctions of the drain region connected to the pad and the additionally-formed active region.

The present invention effectively discharges a negative ESD pulse by a parasitic np diode operation occurring between the n+ junction of the drain region connected to the pad and the p+ junction of the additionally-formed active region.

The forgoing embodiments are merely exemplary and are not to be construed as limiting the present invention. The present teachings can be readily applied to other types of apparatuses, devices or, systems, or any other applicable mediums. The description of the present invention is intended to be illustrative, and not to limit the scope of the claims. Many alternatives, modifications, and variations will be apparent to those skilled in the art.

What is claimed is:

1. A multi-finger type ESD protection device comprising:
   a semiconductor substrate;
   a plurality of first active regions formed on the semiconductor substrate;
   a plurality of gates formed in each of the first active regions;
   a single second active region of a predetermined conductive type formed additionally between the first active regions, wherein the second active region includes an n+ junction connected to Vcc reference voltage or a p+ junction connected to ground Vss, and is without a gate, a source and a drain;

a third active region surrounding the first and second active regions and being of conductivity type different from that of the first active regions; and a plurality of drain regions formed in each of the first active regions, wherein the drain regions include a pair of drain regions formed at n+ junctions of both end portions of each of the first active regions.

2. The device of claim 1, further comprising:

a plurality of source regions each formed between a pair of gates in each of the first active regions.

3. The device of claim 1, wherein the first and second active regions and the gates extend substantially parallel to each other.

4. The device of claim 3, wherein the first and second active regions and the gates have a substantially same shape.

5. A multi-finger type ESD protection device comprising:

a semiconductor substrate;

a plurality of first active regions formed separately on the semiconductor substrate;

a plurality of gates formed in each of the first active regions;

a single predetermined conductive type second active region formed between two of the first active regions, wherein the predetermined conductive type second active region includes an n+ junction connected to Vcc reference voltage, and is without a gate, a source and a drain; and drain regions formed at n+ junctions of both end portions of the first active regions.

6. The device of claim 5, further comprising:

source regions each formed between two gates in each of the first active regions.

7. The device of claim 5, wherein the first and second active regions and the gates extend substantially parallel to each other and have a substantially same shape.

8. The device of claim 5, further comprising:

a third active region surrounding completely the first and second active regions.

9. A multi-finger type ESD protection device comprising:

a semiconductor substrate;

a plurality of first active regions formed separately on the semiconductor substrate;

a plurality of gates formed in each of the first active regions;

a single second active region of a predetermined conductive type, formed between the first active regions, wherein the predetermined conductive type second active region includes a p+ junction connected to ground Vss, and is without a gate, a source and a drain; and drain regions formed at n+ junctions of both end portions of the first active regions.

10. The device of claim 1, wherein the third active region surrounds completely the first and second active regions.

11. The device of claim 10, wherein the third active region has a ring configuration.

12. The device of claim 1, wherein the first active region is of p conductive type.

13. The device of claim 9, further comprising:

source regions each formed between the gates in each of the first active regions.

14. The device of claim 9, wherein the first and second active regions and the gates extend substantially parallel to each other and have a substantially same shape.

15. The device of claim 9, wherein spaces are provided between the first and second active regions.

16. A multi-finger type ESD protection device comprising:

a semiconductor substrate;

a plurality of first active regions formed on the semiconductor substrate;

a plurality of gates formed in each of the first active regions;

at least one second active region of a predetermined conductive type formed additionally between the first active regions, wherein the second active region includes an n+ junction connected to Vcc reference voltage or a p+ junction connected to ground Vss;

a third active region surrounding the first and second active regions and being of conductivity type different from that of the first active regions; and a plurality of drain regions formed in each of the first active regions, wherein the drain regions include a pair of drain regions formed at n+ junctions of both end portions of each of the first active regions.

17. A multi-finger type ESD protection device comprising:

a semiconductor substrate;

a plurality of first active regions formed separately on the semiconductor substrate;

a plurality of gates formed in each of the first active regions;

at least one predetermined conductive type second active region formed between two of the first active regions, wherein the predetermined conductive type second active region is an n+ junction connected to Vcc reference voltage; and drain regions formed at n+ junctions of both end portions of the first active regions.

18. A multi-finger type ESD protection device comprising:

a semiconductor substrate;

a plurality of first active regions formed separately on the semiconductor substrate;

a plurality of gates formed in each of the first active regions;

at least one second active region of a predetermined conductive type, formed between the first active regions, wherein the predetermined conductive type second active region includes a p+ junction connected to ground Vss;

a third active region surrounding the first and second active regions and being of conductivity type different from that of the first active regions; and drain regions formed at n+ junctions of both end portions of the first active regions.

19. The device of claim 9, further comprising:

a third active region surrounding completely the first and second active regions.

* * * * *